United States Patent
Aouine et al.

(10) Patent No.: US 7,817,756 B2
(45) Date of Patent: Oct. 19, 2010

(54) CIRCUIT AND METHOD FOR SUPPRESSING INTERFERENCE COMPONENTS IN RECEIVED SIGNAL

(75) Inventors: Tarik Aouine, Antibes (FR); Frederic Coutant, Grasse (FR); Michel Gaeta, La Valette du Var (FR); Abderrahman Essebbar, Nice (FR); Luc Haumonte, Grasse (FR)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 754 days.

(21) Appl. No.: 11/723,675

(22) Filed: Mar. 21, 2007

(65) Prior Publication Data
US 2008/0013657 A1    Jan. 17, 2008

(30) Foreign Application Priority Data
Mar. 22, 2006   (FR)  .................................... 06 02503

(51) Int. Cl.
H04B 1/10    (2006.01)
(52) U.S. Cl. ........................ 375/350; 375/229; 375/230; 375/231; 375/232; 375/233; 375/316; 375/346; 708/300
(58) Field of Classification Search ................. 375/320, 375/340, 346, 350
See application file for complete search history.

(56) References Cited

U.S. PATENT DOCUMENTS

| | | | |
|---|---|---|---|
| 7,286,006 B2* | 10/2007 | Jaussi et al. | 327/551 |
| 7,623,604 B2* | 11/2009 | Loiseau et al. | 375/350 |
| 2005/0058232 A1* | 3/2005 | Murakami et al. | 375/350 |

FOREIGN PATENT DOCUMENTS

| | | | |
|---|---|---|---|
| FR | 2 846 814 A1 | 5/2004 | |
| FR | 2 846 815 A1 | 5/2004 | |
| FR | 2 846 825 A1 | 5/2004 | |
| FR | 2 859 336 A1 | 3/2005 | |

* cited by examiner

*Primary Examiner*—David C Payne
*Assistant Examiner*—Leon Flores
(74) *Attorney, Agent, or Firm*—Sughrue Mion, PLLC (57) ABSTRACT

A circuit and method for suppressing interference components in a received signal are provided. The circuit includes an adaptive filter configured to process a first quantity of digital signal samples per unit time when the adaptive filter is operating in a first mode, and a second quantity of digital signal samples per unit time when operating in a second mode, wherein the first quantity is less than the second quantity. The method includes implementing an adaptive filter configured to operate in an adaptive mode and in a second mode having a reduced adaptability compared to the adaptive mode; operating the adaptive filter in the adaptive mode to process a first quantity of digital signal samples per unit time; and operating the adaptive filter in the second mode to process a second quantity of digital signal samples per unit time; wherein the first quantity is less than the second quantity.

33 Claims, 7 Drawing Sheets

| | NON-ADAPTIVE MODE (Signal of Interest) | ADAPTIVE MODE (No Signal of Interest) |
|---|---|---|
| Calculations | Filtering: $$e(t) = S(t) - \sum_{i=1}^{N} C_i^*(t) S(t-i)$$ | Filtering: $$e(t) = S(t) - \sum_{i=1}^{N} C_i^*(t) S(t-i)$$ Power computation: $$P(t) = P(t-1) - S(t-N)S^*(t-N) + S(t)S^*(t)$$ Filter taps update: $$C_i(t+1) = (1 - \lambda\mu) C_i(t) + \frac{\mu}{P(t)} e(t) S^*(t-i)$$ |
| Computation Load | [N multiplications + N additions] (for filtering) | [N multiplications + N additions] (for filtering) + [N multiplications + N additions] (for taps update) + [1 multiplication + 2 additions] (for power) Assuming that $(1-\lambda\mu)$ and $\frac{\mu}{P(t)}$ are power of 2 and are operated by bits shifts in fix point implementation |
| Approximate Computation Load | N multiplications | 2N+1 multiplications |
| | Assuming that addition computation load is negligible in comparison to multiplication. | |

| MODE | Adaptivemode | Non-adaptivemode | Adaptive mode |
|---|---|---|---|
| 54a — FIR1: | | Running on Multiplyer 1 | |
| Correlation estimation | Running on Multiplyer 1 | Running on Multiplyer 1 | |
| 32 — Signal detection | | Running on Multiplyer 1 | |
| 54b — FIR2: | Stopped | Running on Multiplyer 2 | Stopped |
| 68 — Filter tap update | Running on Multiplyer 2 | Stopped | Running on Multiplyer 2 |
| 40/41 — Jammer command | Stopped | Running on Multiplyer 2 | Stopped |
| 34 — Demodulation | Stopped | Running on Multiplyer 2 | Stopped | when a signal of interest is detected [1]
- The jammer command trigs from 1 to 0. This corresponds to the change of phase [2]:
- The learning module is stopped
- The FIR2, processing the data not yet processed by the FIR 1, starts.
- The demodulation starts when the reception is considered as finished or not valid:
- The jammer command switches on
- The detection signal switches on.
- The demodulation and FIR2 are stopped
- The learning module is started.

CIRCUIT AND METHOD FOR SUPPRESSING INTERFERENCE COMPONENTS IN RECEIVED SIGNAL

CROSS-REFERENCE TO RELATED APPLICATION

This application claims priority from French Patent Application No. 0602503, filed Mar. 22, 2006, in the French Patent Office, the entire contents of which are incorporated herein by reference.

BACKGROUND OF THE INVENTION

1. Field of the Invention

Apparatuses and methods consistent with the present invention relate to an electronic adaptive filter for use in processing a communications signal to suppress the effects of interference, and more specifically to an electronic adaptive filter for use in processing a frequency shift keyed (FSK) and/or amplitude shift keyed (ASK) signal.

2. Description of the Related Art

Published French Patent Applications Nos. 2846814, 2846815, 2846825 and 2859336 describe versions of a highly versatile processing system for robustly demodulating a received FSK signal, even when the received FSK signal is in the presence of coherent interference that may be close in frequency to one of the FSK frequencies. Close frequency coherent interference is a type of interference that can severely affect the ability of a receiver to correctly demodulate a desired FSK signal, especially if the close-frequency interference is of greater power than the received FSK signal. Coherent interference is also referred to herein as a "jammer" (i.e., it can jam the ability of a demodulator to correctly demodulate FSK).

A feature of the systems described in published French Patent Applications Nos. 2846814, 2846815, 2846825 and 2859336 is a digital filter for removing jammer signals. The digital filter is operable in adaptive and non-adaptive modes, depending on whether a signal of interest is detected to be present. The adaptive mode is selected when there is no detected signal of interest. In the adaptive mode, the filter coefficients are re-calculated adaptively, so that the filter adapts to cancel out all coherent components appearing in the signal. The non-adaptive mode is selected in response to detection of a signal of interest. In the non-adaptive mode, the values of the filter coefficients are frozen, such that the filter does not adapt to cancel out the signal of interest. Thus the adaptive mode allows the filter to adapt to cancel out jammers as and when they occur in the changing operating environment of the receiver, so that when a signal of interest is received, the filter is already optimized to cancel the existing interference but not the signal of interest.

A result of this operation is that a computation load of the digital filter is higher in the absence of a signal of interest than when a signal of interest is present. In the absence of a signal of interest, the filter in its adaptive mode performs both adaptation and filter calculations, whereas when a signal of interest is present, the filter in its non-adaptive mode performs only the filter calculations.

The computation load of the filter represents a significant part of the computation load of the receiver. A high computation load requires significant receiver and processing resources, such as more extensive circuitry that occupies valuable die space of an integrated circuit, or higher processor occupation of a digital signal processor (DSP), or a faster DSP processor speed. In all cases, a high computation load also results in increased power consumption from the power supply.

From a design point of view, it is desirable that the receiver be provided with sufficient processing resources to support the computation load for receiving and demodulating a desired signal of interest. A relatively higher computation load when no signal of interest is present means that the receiver has to be provided with more processing resources than those used for reception and demodulation of a signal of interest. Moreover, in a typical application of the receiver, e.g., as a remote control receiver for a vehicle, the receiver will spend a significant portion of its time without receiving a signal of interest, which means that the higher computation load of the adaptive mode of the filter impacts the design, power consumption and performance of the entire receiver.

Figure 1:
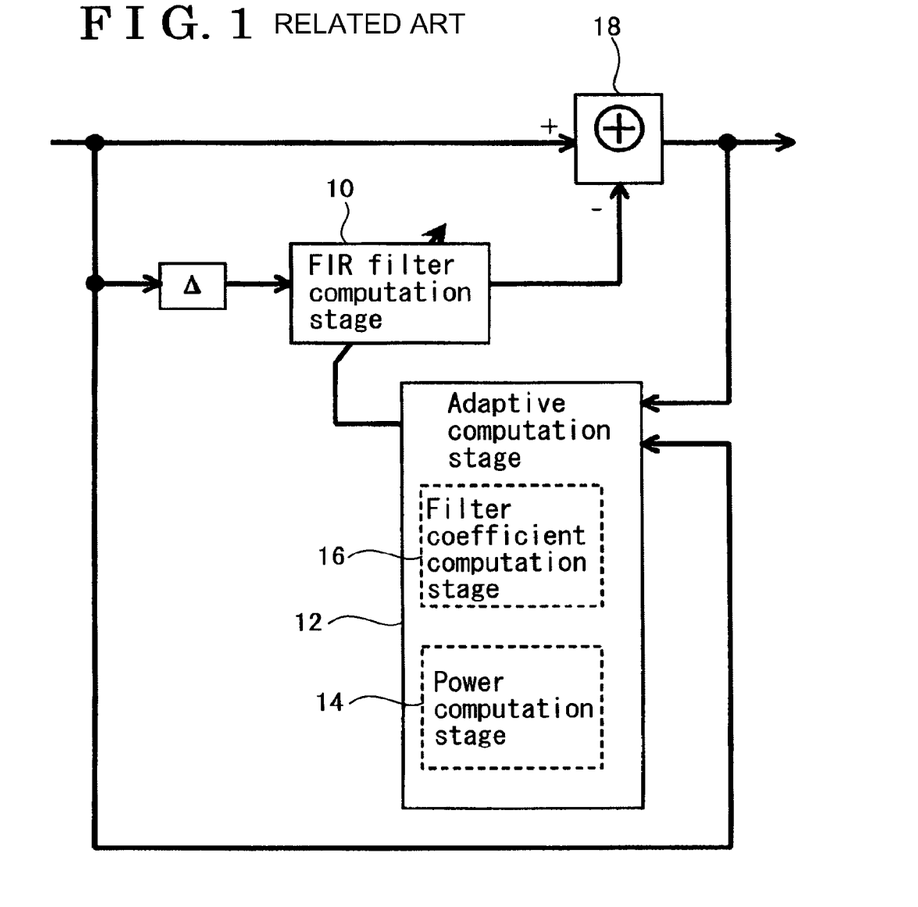
FIG. 1 is a schematic illustration of a related art implementation of a FIR Wiener adaptive digital filter.
Figure 2:
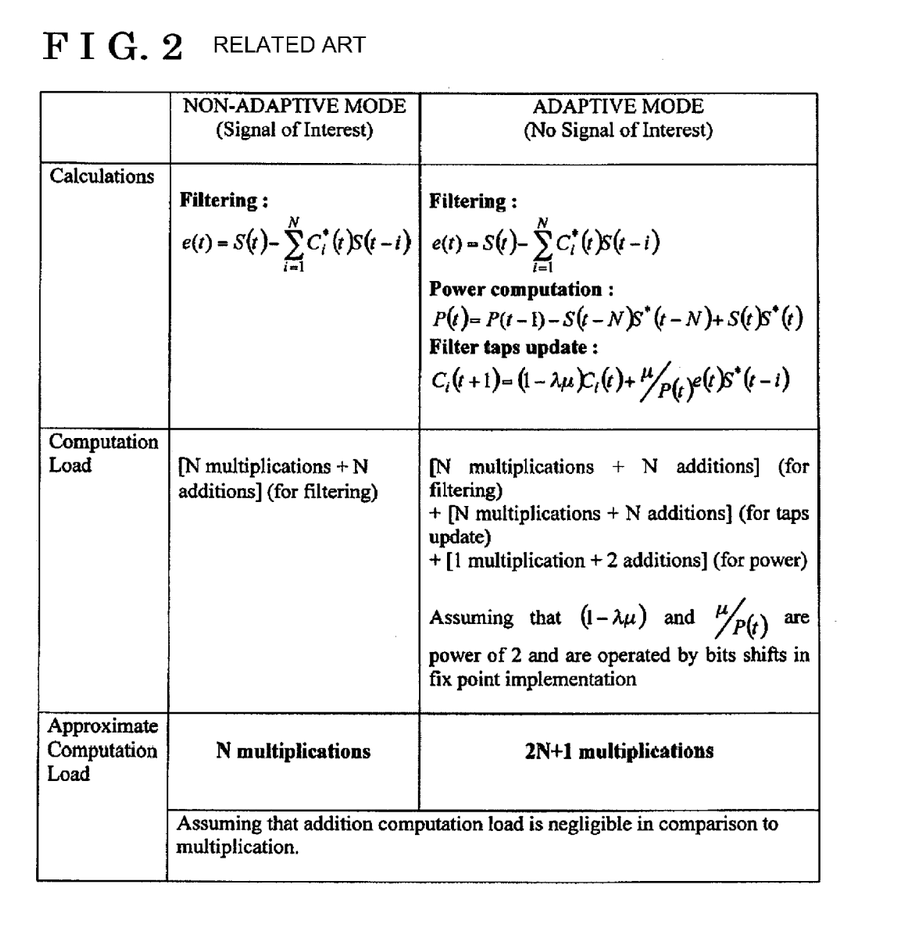
FIG. 2 is a schematic illustration of computation loads in the filter of FIG. 1.

To illustrate the relative computation loads in the adaptive and non-adaptive modes of the filter, FIG. 1 illustrates an example of the main computational stages of a related art Finite Impulse Response (FIR) implementation of a Wiener filter, and FIG. 2 illustrates a computation load for each computation stage of the exemplary related art filter of FIG. 1, where a value N denotes a number of filter taps implemented. Turning to FIG. 1, the computation stages include an FIR filter computation stage 10 used in both the adaptive and non-adaptive modes, and an adaptive computation stage 12 that is used only in the adaptive mode. The FIR filter computation stage 10 is a main filtering stage at which filter coefficients $C_i^*$ are applied at time signal samples $S(t-i)$, and a result of the application is subtracted from the input signal by an adder 18. The adaptive computation stage 12 includes a power computation stage 14, and a filter coefficient computation stage 16. The filter coefficient computation stage 16 is the a stage for adaptive updating of the filter coefficients $C_i^*$ using a normalised least minimum square (NLMS) algorithm. The power computation stage 14 computes a normalization factor for the filter coefficient computation stage 16.

In the adaptive mode (no signal of interest), all of the computation stages, i.e., the FIR filter computation stage 10, the adaptive computation stage 12 and the power computation stage 14 and filter coefficient computation stage 16 included therein are performed. For each digital sample input to the filter, the computation load is approximately 2N+1 multiplications. In the non-adaptive mode (signal of interest detected), only the FIR filter computation stage 10 is used, and the computation load is approximately N multiplications. (see FIG. 2). Thus, with the filter implementation of FIG. 1, the computation load in the adaptive mode is roughly double that of the non-adaptive mode.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

According to an aspect of the present invention, a processor circuit for suppressing interference in a received signal represented as digital signal samples is provided. The processor circuit comprises an adaptive filter which is configured to process a first quantity of digital signal samples per unit time when the adaptive filter is operating in a first mode, and a second quantity of digital signal samples per unit time when the adaptive filter is operating in a second mode, wherein the first quantity is less than the second quantity.

According to another aspect of the present invention, a processor circuit for suppressing interference in a received signal represented as digital signal samples is provided. The processor circuit comprises an adaptive filter which is configured to operate in an adaptive mode in which the adaptive filter adapts to changes in the received signal, and in a non-adaptive mode in which the adaptive filter has a reduced adaptability compared to the adaptive mode; wherein the adaptive filter comprises a first calculation circuit and a second calculation circuit, and wherein the processor circuit is configured such that: in the non-adaptive mode, the first calculation circuit and the second calculation circuit both perform a filter calculation for applying digital filter coefficients to the digital signal samples; and in the adaptive mode, the first calculation circuit performs a filter calculation, and the second calculation circuit performs a coefficient update calculation for adaptively updating the digital filter coefficients.

According to another aspect of the present invention, an integrated circuit is provided. The integrated circuit comprises a processor circuit for suppressing interference in a received signal represented as digital signal samples, the processor comprising an adaptive filter which is configured to process a first quantity of digital signal samples per unit time when the adaptive filter is operating in a first mode, and a second quantity of digital signal samples per unit time when the adaptive filter is operating in a second mode, wherein the first quantity is less than the second quantity.

According to another aspect of the present invention, an integrated circuit is provided. The integrated circuit comprises a processor circuit for suppressing interference in a received signal represented as digital signal samples, the processor circuit comprising an adaptive filter which is configured to operate in an adaptive mode in which the adaptive filter adapts to changes in the received signal, and in a non-adaptive mode in which the adaptive filter has a reduced adaptability compared to the adaptive mode; wherein the adaptive filter comprises a first calculation circuit and a second calculation circuit, and wherein the processor circuit is configured such that: in the non-adaptive mode, the first calculation circuit and the second calculation circuit both perform a filter calculation for applying digital filter coefficients to the digital signal samples; and in the adaptive mode, the first calculation circuit performs a filter calculation, and the second calculation circuit performs a coefficient update calculation for adaptively updating the digital filter coefficients.

According to anther aspect of the present invention, a receiver is provided. The receiver comprises a processor circuit for suppressing interference in a received signal represented as digital signal samples, the processor comprising an adaptive filter which is configured to process a first quantity of digital signal samples per unit time when the adaptive filter is operating in a first mode, and a second quantity of digital signal samples per unit time when the adaptive filter is operating in a second mode, wherein the first quantity is less than the second quantity.

According to anther aspect of the present invention, a receiver is provided. The receiver comprises a processor circuit for suppressing interference in a received signal represented as digital signal samples, the processor circuit comprising an adaptive filter which is configured to operate in an adaptive mode in which the adaptive filter adapts to changes in the received signal, and in a non-adaptive mode in which the adaptive filter has a reduced adaptability compared to the adaptive mode; wherein the adaptive filter comprises a first calculation circuit and a second calculation circuit, and wherein the processor circuit is configured such that: in the non-adaptive mode, the first calculation circuit and the second calculation circuit both perform a filter calculation for applying digital filter coefficients to the digital signal samples; and in the adaptive mode, the first calculation circuit performs a filter calculation, and the second calculation circuit performs a coefficient update calculation for adaptively updating the digital filter coefficients.

According to another aspect of the present invention, a method of processing a received signal to suppress interference in the received signal is provided. The method comprises implementing an adaptive filter which is configured to operate in an adaptive mode to adapt to changes in the received signal, and in a second mode having a reduced adaptability compared to the adaptive mode; operating the adaptive filter in the adaptive mode to process a first quantity of digital signal samples per unit time; and operating the adaptive filter in the second mode to process a second quantity of digital signal samples per unit time; wherein the first quantity is less than the second quantity.

According to another aspect of the present invention, a method of processing a received signal to suppress interference in the received signal is provided. The method comprises operating the filter in the second mode comprises configuring at least one calculation circuit that is dedicated to performing numerical calculations, to perform a first calculation forming at least part of a filter result calculation based on filter coefficients; and operating the filter in the adaptive mode comprises configuring the at least one calculation circuit to perform, for at least part of a time the adaptive filter is operating in the adaptive mode, a second calculation forming at least part of a calculation for updating the filter coefficients.

According to another aspect of the present invention, a method of processing a received signal to suppress interference in the received signal is provided. The method comprises adaptively filtering the received signal by processing a first quantity of digital signal samples per unit time in order to detect a signal of interest; upon detecting the signal of interest, filtering the received signal by processing a second quantity of digital signal samples per unit time, wherein the first quantity is less than the second quantity Other aspects and features of the invention may be apparent from the following description. The Applicant claims protection for any novel feature or idea described herein whether or not emphasis is currently placed thereon.

BRIEF DESCRIPTION OF THE DRAWINGS

The above and/or other aspects of the present invention will become more apparent by describing in detail exemplary embodiments thereof with reference to the attached drawing figures, wherein.

DETAILED DESCRIPTION OF EXEMPLARY EMBODIMENTS OF THE PRESENT INVENTION

Figure 3:
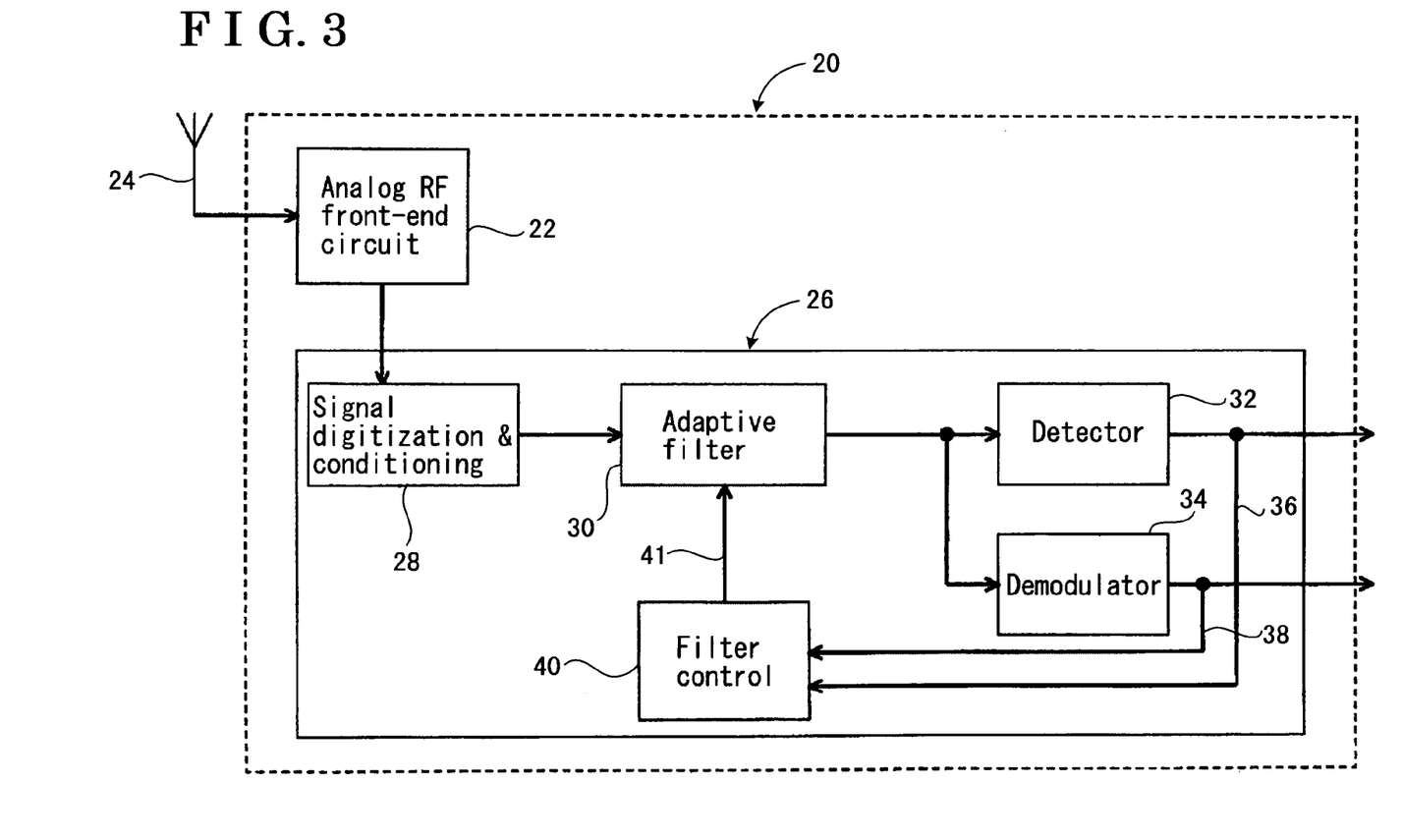
FIG. 3 is a schematic illustration of a signal receiver using an adaptive filter according to an exemplary embodiment of the present invention.

Referring to FIG. 3, a receiver 20 is illustrated for receiving and demodulating a wireless communication signal. The wireless communication signal may, for example, be an FSK and/or an ASK signal. The receiver 20 may find use in many different applications, for example, in a vehicle for receiving a remote control signal transmitted from a remote-control key or key-card, or a building security system, or any remote-control system that may encounter noise interference in use.

The receiver 20 comprises an analog Radio Frequency (RF) front-end circuit 22 that receives an RF input signal from an antenna 24. The RF front-end circuit 22 may partly filter the received signal, and down-convert the received signal to an intermediate frequency (IF) signal suitable for digitization and digital processing by a processing circuit 26.

The processing circuit 26 may be implemented in one or more integrated circuits. For example, the processing circuit 26 may be implemented on an Application Specific Integrated Circuit (ASIC). The processing circuit 26 comprises a signal digitization and conditioning section 28; an adaptive filter 30; a detector 32 for detecting reception of a signal of interest; a demodulator 34 for demodulating the received signal if a signal of interest is present; and a filter control section 40 for controlling the operating mode of the adaptive filter 30 in response to signals 36 and 38 from the detector 32 and the demodulator 34, respectively. The signal digitization and conditioning section 28, adaptive filter section 26, detector 32, demodulator 34, and filter control section 40 may be implemented as respective dedicated circuits, or as selectively configurable hardware circuits, or as software (e.g. processing algorithms) executed by a processor (e.g. a digital signal processor (DSP)), or as a combination of any of these. In the case of implementation by software, it may be appreciated that the schematic drawings may represent processing modules and/or information flow through the processing stages, but without any limitations as to execution timing.

The signal digitization and conditioning section 28 may comprise an analog-to-digital converter (not shown) for digitizing the analog IF signal from the analog RF front-end circuit 22, and one or more conditioning sections (not shown) for converting the digitized signal to a complex baseband, the conversion being based on a frequency near the carrier frequency of the FSK or ASK modulation.

The adaptive filter 30 substantially cancels all coherent (i.e., stable) signal components other than a signal of interest. To do this, the adaptive filter 30 operates selectively either in an adaptive mode when no signal of interest is detected to be present, or in a non-adaptive mode when a signal of interest is detected to be present. The phrase "signal of interest" includes a signal that may potentially be a desired signal to be received, before the authenticity of the signal of interest may be validated. The filter control section 40 is configured to generate a control signal 41 (i.e., a "Jammer command") for controlling an operating mode of the adaptive filter 30 depending on whether the signal 36 from the detector 32 indicates a signal of interest and/or whether the signal 38 from the demodulator 34 is a valid demodulated signal (e.g., the demodulated signal is well behaved, such as obeying transition timings set in the modulation scheme). The filter control section 40 operates a multi-stage control strategy. For example, in the absence of any signal of interest, the control circuit 40 controls the filter 30 to be in its adaptive mode (i.e., Jammer command signal 41 asserted). When the detector 32 detects a new signal of interest, the control circuit 40 implements a first response stage rapidly to switch the adaptive filter 30 to its non-adaptive mode (i.e., Jammer command signal 41 deasserted), and hence ensures that the adaptive filter 30 does not cancel out the signal of interest. Thereafter, the filter control section 40 waits for the signal 38 to begin to arrive from the demodulator 34 to decide the second control stage, namely whether the signal of interest is valid. If the signal of interest is valid, then the filter control section 40 keeps the filter 30 in its non-adaptive mode, such that the desired signal is not cancelled out, and is allowed to pass through the adaptive filter 30 to continue to be demodulated. However, if the signal of interest is not valid (or if a valid transmission has now stopped), the filter control section 40 switches the adaptive filter 30 back to its adaptive mode to allow the filter to cancel out all signal components, and thus returns the processing circuit 26 to a state of waiting for a new signal of interest.

The adaptive filter 30 may implement a Wiener fixed-point normalized Least Minimum Square (NLMS) adaptive filter with leakage. The Wiener algorithm is expressed by the following equations and definitions:

Eq. 1 Compute Filter Output:

$$e(t) = S(t) - \sum_{i=1}^{N} C_i^*(t)S(t-i)$$

Eq. 2 Compute Instantaneous Power $$P(t)=P(t-1)-S(t-N)S^*(t-N)+S(t)S^*(t)$$

Eq. 3 NLMS Algorithm:

$$C_i(t+1)=C_i(t)+\mu/P(t)e(t)\cdot S^*(t-i)$$

or

Eq. 4 Leaky NLMS Algorithm:

$$C_i(t+1)=(1-\lambda\mu)C_i(t)+\mu/P(t)e(t)\cdot S^*(t-i)$$

Where:
S*(t) denotes a complex conjugate of an input signal at instant t.
N denotes a filter length (number of taps)
P(t) denotes a power of the input signal at time t averaged over the filter length.
$C_i(t)$ denotes a filter tap, element $i^{th}$ at time t.
e(t) denotes an error signal at time t.
μ denotes a least minimum square (LMS) step size
(1−λμ) denotes a leakage factor, close to 1.
Normalized LMS:
The filter structure is FIR. The taps update is using Least Min Square criteria: second order orthogonal criteria.
The update speed does not depend on the signal magnitude because of normalization at taps update level (term with P(t)).
Adaptive:
The FIR taps are updated at each new sample.
Adaptive updating is stopped when incoming signal of interest is detected.
Leakage: A leakage function may be used to assure LMS stability in fix point implementation. The principle of a leaky LMS is to introduce a bias so that in an absence of noise:
The bias prevents coefficients of the filter to diverge,
Past learned frequencies are progressively forgotten. In practice, progressively forgetting past learned frequencies is achieved by modifying the coefficients update by introducing a leakage factor (1−λμk): old values of the coefficients are multiplied by the leakage factor before updating (cf. equations above). The leakage factor is close to 1 and acts as a forgetting factor.

Equation 1 represents a calculation of a filter output using filter coefficients $C_i^*$. Equation 2 represents a power calculation for calculating a normalization factor $P(t)$ used in the equations for calculating the filter coefficients. Equations 3 and 4 represent alternative filter coefficient updating calculations, and which equation (i.e., Eq. 3 or Eq. 4) is selected depends on desired design criteria.

In the non-adaptive mode, only Equation 1 is calculated. As explained previously, the computation load depends on the multiplication operations, which are the most computationally intensive. The computation load for the non-adaptive mode may be approximated to be N multiplications per sample.

In the adaptive mode, both Equations 1 and 2, and one of Equations 3 and 4, are calculated. Equations 2-4 perform adaptive updating of the filter coefficients while Equation 1 applies the filter coefficients to generate a filter output. The computation load again depends on the multiplication operations, and may be approximated to be 2N+1 multiplications per sample, roughly double the computation load per sample of the non-adaptive mode. The value of N may be relatively high, at least 20 and more typically a value of about 30 to 32.

In the above calculations, the non-adaptive mode is a mode in which no adaptive updating of the filter coefficients takes place. However, it may be appreciated that the non-adaptive mode has a reduced degree of adaptation compared to the adaptive mode, and accordingly a smaller computation load per sample than the adaptive mode. The present inventive concept may be applied to any relative ratio of computation loads per sample.

According to an exemplary embodiment of the present invention, the number of samples processed by the adaptive filter 30 is controlled such that, in the adaptive mode, the adaptive filter 30 processes fewer samples per unit time than in the non-adaptive mode. Thus, in the non-adaptive mode, the adaptive filter 30 processes all samples, whereas in the adaptive mode, the adaptive filter 30 processes approximately half of the samples. By processing fewer samples, the relatively high computation load of the adaptive calculations is spread over a longer computation time (i.e., the time associated with two samples), so that the computation load per unit time is roughly the same in both the adaptive and non-adaptive modes. This technique is advantageous, as it enables the high computation load of the adaptive mode to be performed using the processing resources associated with the computation load of the non-adaptive filter mode, thereby reducing the average required resources. Accordingly, the average computational load per unit time may be balanced in both the adaptive and non-adaptive modes of the filter.

For example, using the example computation loads illustrated in FIG. 2, during the adaptive mode the computation load (about 2N multiplications) per sample may be roughly double that of the non-adaptive mode (N multiplications). By controlling the adaptive mode of the filter to process only about half the number of samples per unit time, the net computation load is halved (i.e., ½×2N=N multiplications) so that the two modes have roughly the same computation load per unit time.

The ratio of the number of samples processed per unit time in the adaptive and non-adaptive modes may be approximately the same as the ratio of the computational load per sample in each of the non-adaptive and adaptive modes, respectively.

In the adaptive mode, the samples may be selected for processing in groups of contiguous samples. For example, out of P samples, a first group of P/2 contiguous samples may be selected for processing, and the following group of P/2 contiguous samples may be dropped. Processing the samples as contiguous groups is advantageous in providing better optimization of the filter coefficients. The size of the groups (dependent on the value of P) may be selected depending on a desired memory size and desired frequency of coefficient updates. The larger the group, the more accurate the calculation of the filter coefficients. However, a larger group uses more memory to store the contiguous sample values for processing, and also creates a longer delay between updates. Using a larger group may also delay updating of the output signal to the detector. A group size can easily be found that can balance the different characteristics depending on a desired performance of the filter.

When a signal of interest is present and the filter is in the non-adaptive mode, a large number of samples (e.g., all available input samples) is processed by the filter, per unit time, to generate a good quality (high continuity) signal for the demodulator. Thus no degradation of the signal for demodulation occurs. The resulting filter signal may be stored in a storage medium or sent directly to the demodulator for demodulation before storage. When no signal of interest is present, and the filter is switched to the adaptive mode, the reduction in the number of samples processed per unit time may reduce the quality of the signal fed to the detector. However, the detector is much less sensitive to signal quality than the demodulator, since the function of the detector is merely to detect the presence of any kind of signal of interest. Thus the operation of the detector is not significantly affected, and desired receiver functionality can be achieved with significantly reduced power consumption.

In addition to power consumption reduction, the present inventive concept allows a receiver to be implemented having a minimum computation power to handle the computation load associated with the processing of a signal of interest. The computation load (per unit time) of the filter in the absence of a signal of interest is made approximately the same as when a signal of interest is present. Accordingly, the receiver does not need to be provided with any additional hardware resources to accommodate the computation overhead of the adaptive filter mode.

For example, the processing circuit for implementing the digital filter may comprise at least one calculation circuit for performing a numerical calculation. During the non-adaptive mode, the calculation circuit may be used by the filter to perform only filter calculations, and at a rate to keep up with the full sample rate passing through the filter. During the adaptive mode, the calculation circuit may be used at least part of the time for performing filter update calculations.

The calculation circuit may be a multiplier circuit. Multiplication is a computationally intensive task that is used extensively in the arithmetic calculations to update the filter coefficients. While multiplier circuits can ease the processing load, each multiplier circuit may be relatively complex and may occupy valuable chip area. By enabling the multiplier circuits to be shared between different tasks depending on whether the filter is in its adaptive or non-adaptive mode, the number of individual multiplier circuits used can be kept desirably small.

Alternately, the processing circuit may comprise first and second calculation circuits of the same type, for example, both multipliers. The use of multiple calculation circuits enables the processor to perform parallel processing tasks, and thereby achieve greater processing throughput for a given processor clock speed. In the non-adaptive filter mode, the first and second calculation circuits may both be used to perform filter calculation tasks. In the adaptive filter mode, at least one of the calculation circuits may be used, at least part time, to perform filter update calculation tasks. For example, the first calculation circuit may be used to perform filter calculation tasks, whereas the second calculation circuit may be used to perform filter update calculation tasks.

Figure 4:
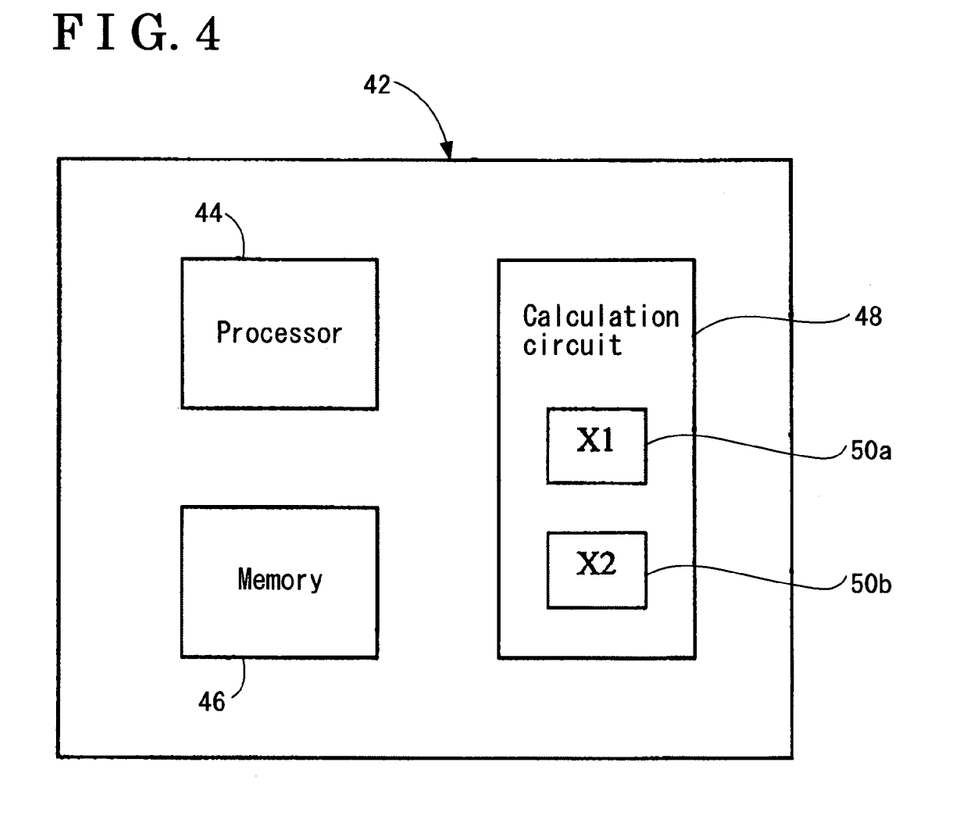
FIG. 4 is a schematic illustration of a digital signal processor used in the receiver of FIG. 3 according to an exemplary embodiment of the present invention for implementing at least the adaptive filter.

FIG. 4 illustrates schematically a Digital Signal Processor (DSP) 42 for executing software for implementing an adaptive filter 30 of the processing circuit 26 according to an exemplary embodiment of the present invention. The DSP 42 comprises a processor 44 for executing processing tasks, a memory 46 for storing processing algorithms and data, and a dedicated calculation circuit 48 for performing numerical calculations. The dedicated calculation circuit 48 comprises a first multiplier 50a and a second multiplier 50b.

Figure 5:
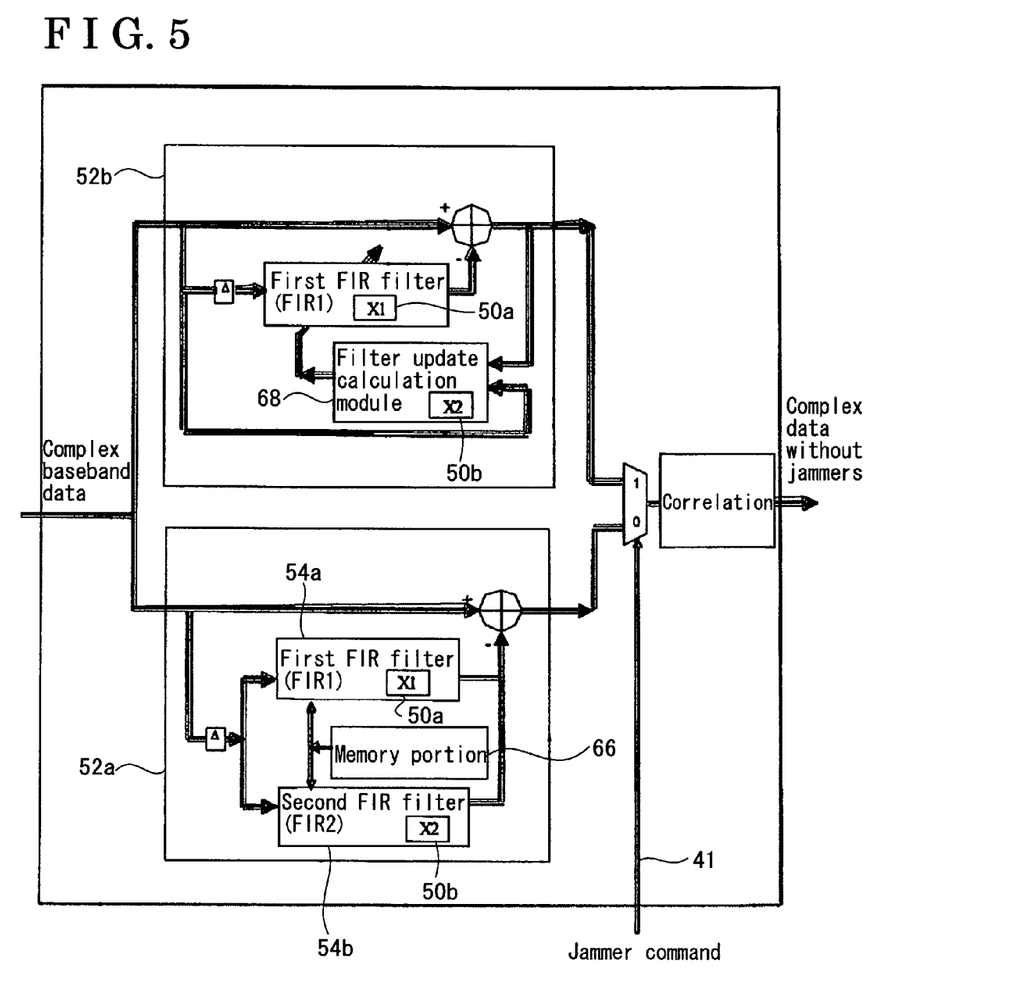
FIG. 5 is a schematic illustration of functionality implemented by the filter of FIG. 3 in its different adaptive and non-adaptive modes.
Figure 6A:
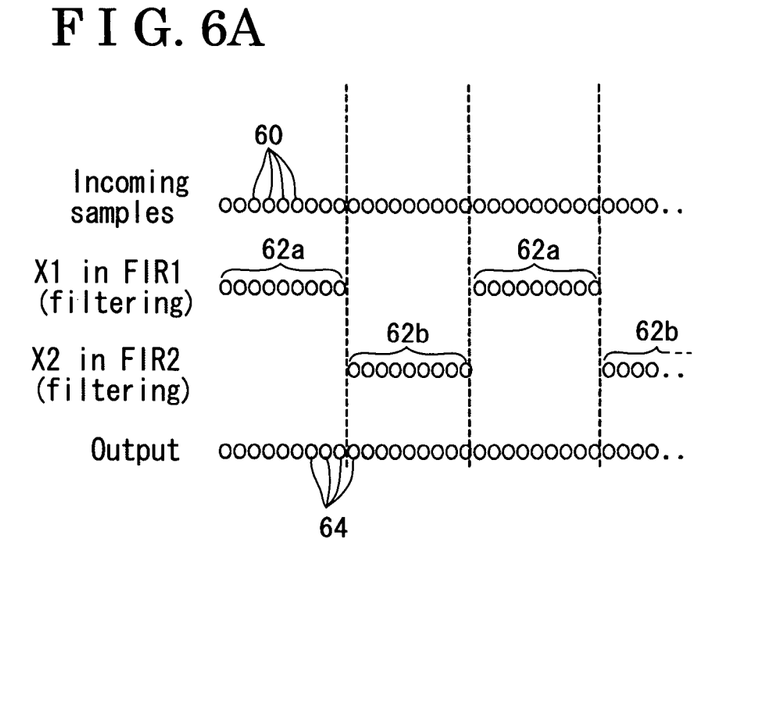
FIGS. 6A and 6B are schematic diagrams illustrating an allocation of processing of signal samples in the non-adaptive and adaptive filter modes, respectively.
Figure 6B:
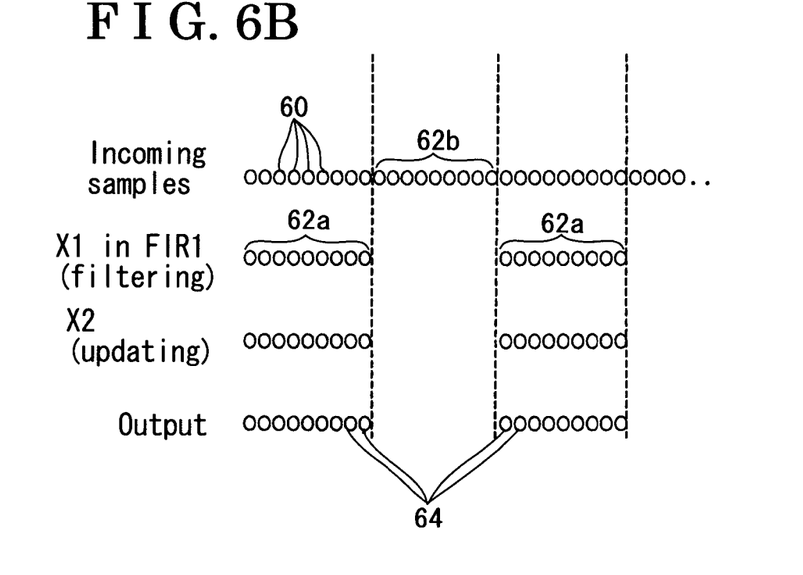
Figure 7:
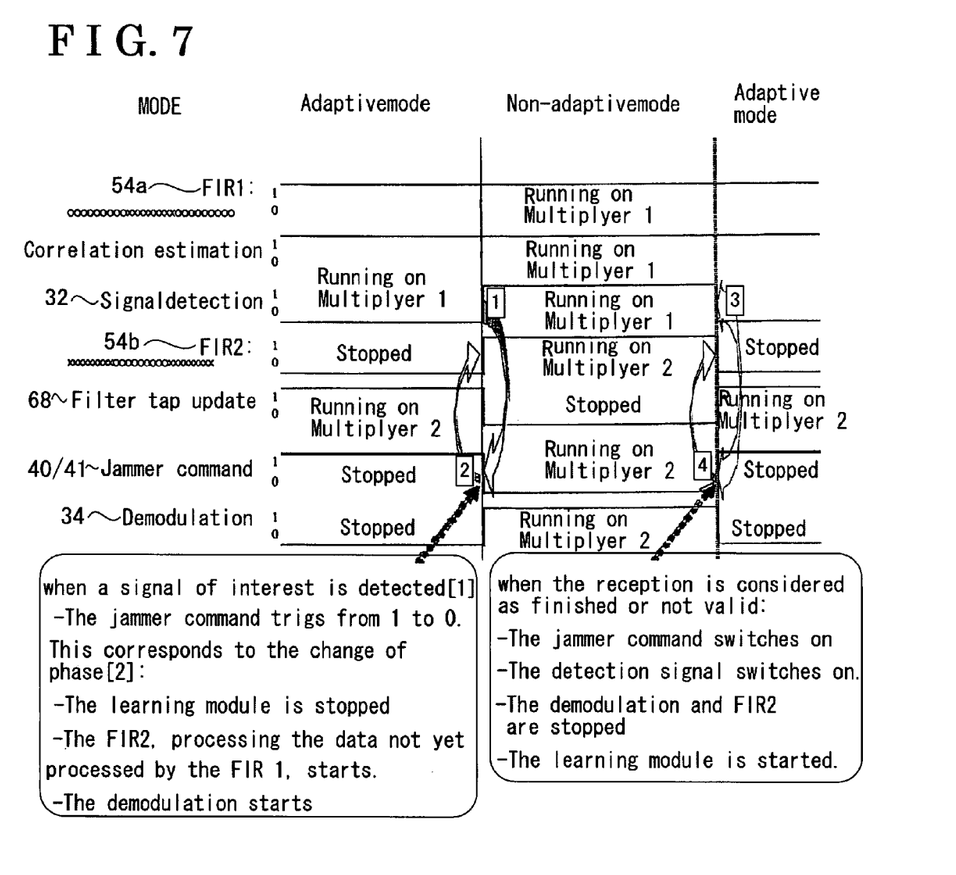
FIG. 7 is a schematic diagram illustrating a workload in the different adaptive and non-adaptive filter modes.

Referring to FIGS. 5, 6 and 7, an exemplary embodiment of the present invention implements the non-adaptive and adaptive modes of the adaptive filter 30 as two different filter modules, a first filter module 52a and a second filter module 52b. These two filter modules are not implemented together in the circuit but the system is setup to be organized so that the first filter module 52a may be used to implement the non-adaptive mode (signal of interest) and the second filter module 52b may be used to implement the adaptive mode (no signal of interest).

In the non-adaptive mode, the first filter module 52a is implemented as two Finite Response Filters (FIRs), a first FIR 54a (i.e., FIR1) and a second FIR 54b (i.e., FIR2) in parallel with each other. A first multiplier 50a is allocated to the first FIR 54a for performing the computationally intensive multiplications for the first FIR 54a. A second multiplier 50b is likewise allocated to the second FIR 54b. The two parallel FIRs may be implemented as a way of enabling a high throughput of filtered data despite relatively long filter lengths (N~30) and a limited clock speed of the DSP. Performing the filter calculation (Equation 1) for one sample may actually take up to two sample periods. By implementing two parallel FIRs, i.e., the first FIR 54a and the second FIR 54b, each with its own respective dedicated multiplier circuit 50a, 50b, respectively, the samples can be processed at full rate.

For example, referring to FIGS. 6a and 7, in the non-adaptive mode, incoming samples 60 are split into alternate groups 62a and 62b of contiguous samples. In FIG. 6A, each sample 60 is denoted schematically by a open circle "o". The first group 62a (e.g., odd numbered group) may be allocated to the first FIR 54a, and the second group 62b (e.g., even numbered group) may be allocated to the second FIR 54b in a time staggered manner. Although each of the first FIR 54a and the second FIR 54b may occupy up to two group periods to perform its respective calculation, each of the first FIR 54a and the second FIR 54b receives the samples 60 at only a half rate, and so the overall sample rate calculation can be fully executed on time. The filter output 64 is reconstituted from the time sampled outputs of both the first FIR 54a and the second FIR 54b.

In the non-adaptive mode, the filter coefficients may be frozen, and stored in a memory portion 66 (for example, a portion of the DSP memory 46).

In the second filter module 52b for the adaptive filter mode, the first FIR 54a (i.e., FIR1) is retained, but the second FIR 54b is no longer implemented. Instead, a second multiplier 50b is allocated to a filter update calculation module 68. The filter update calculation module 68 thus uses some of the same processing resources (i.e., the second multiplier 50b) as those used in the non-adaptive mode. Accordingly, no additional processing resources need to be provided for the adaptive mode, since the entire computation load may be accommodated using the same processing resources as those used by the non-adaptive mode.

As indicated above, in the adaptive mode, the adaptive filter 30 processes only half the number of samples per unit time. The first FIR 54a (i.e., FIR1) is able to process half the samples at the desired processing rate (this is a function of the first FIR 54a even in the non-adaptive mode). Referring to FIGS. 6b and 7, in the case of the adaptive mode, the incoming samples 60 are again grouped into two alternate groups 62a and 62b of contiguous samples. The first group 62a (e.g., odd numbered group) is allocated in parallel to the first FIR 54a for filtering and to the filter update calculation module 68 for processing. The second group 62b (e.g. even numbered group) 62b is dropped from processing. The computation load of the filter update calculation module 68 is thus the same as that of the first FIR 54a, namely about N multiplications per sample. Processing each sample of the first group 62a takes up to two sample periods. However, only half of the number of samples arriving per unit time are processed in the adaptive mode, and so the adaptive filter processing can be performed in the time available despite the fact that no additional processing resources are used.

Operation of the adaptive filter according to an exemplary embodiment of the present invention described above does not degrade the performance of the demodulator 34 or the detector 32 in the receiver. The demodulator 34 is only used when a signal of interest is present. The demodulator 34 is deactivated in the absence of a signal of interest, because the demodulation results are not useful. The operating mode of the adaptive filter 30 in the presence of a signal of interest is the non-adaptive mode in which all signal samples are processed, and there is no degradation in the quality of the filtered signal generated by the adaptive filter 30. When the filter is switched to the adaptive mode in the absence of a signal of interest, the signal output from the adaptive filter 30 may be of reduced quality, because the signal output is missing half of the samples. However, this signal is used only by the detector 32 to detect a presence of a signal of interest based on large changes occurring in the signal. Accordingly, such detection is reliable even when some samples of the signal are dropped. Thus the adaptive filter operation allows full performance of the demodulator 34 and the detector 32.

The number of samples 60 in each group 62a and 62b may be selected according to the design criteria of the processing circuit 26 and the receiver. The number of samples 60 selected is generally based on balancing various factors. A larger number of samples 60 per group 62a and 62b improves efficiency of the update calculations performed by the filter update calculation module 68, because the calculations are then based on a larger number of representative samples. However, increasing the number of samples 60 per group 62a and 62b also means that more memory is used for storing the sample values, and the update period (i.e., the period at which the filter coefficients my be updated) becomes correspondingly longer. According to an exemplary embodiment of the present invention, the number of samples 60 per group 62a and 62b is in the range of approximately 5 to approximately 15, with a value of approximately 9 being typical (i.e., denoted by a series of nine open circles "o" in FIGS. 6A and 6B).

Thus it will be appreciated that exemplary embodiments of the present invention enable the computationally intensive adaptive mode of the filter to be implemented without having to increase the processing resources beyond the resources used for the less computationally intensive non-adaptive mode, and without degrading the receiver performance. The circuit complexity and power consumption are both also reduced compared to a related art implementation of the adaptive filter.

The foregoing description is merely illustrative of exemplary embodiments of the present invention. Many modifications, developments and equivalents will be understood by one having ordinary skill in the art, and may be used without departing from the scope of the invention as defined in the following claims.

What is claimed is:

1. A processor circuit for suppressing interference in a received signal represented as digital signal samples, the processor circuit comprising:

an adaptive filter which is configured to process a first quantity of digital signal samples per unit time when the adaptive filter is operating in a first mode, and a second quantity of digital signal samples per unit time when the adaptive filter is operating in a second mode, wherein the first quantity is less than the second quantity;

wherein the first mode is an adaptive mode in which the adaptive filter adapts to changes in the received signal, and the second mode is a non-adaptive mode having a reduced adaptability compared to the adaptive mode;

wherein the adaptive filter is configured to perform a first computation load per sample when the adaptive filter is operating in the adaptive mode, and a second computation load per sample when the adaptive filter is operating in the non-adaptive mode, the second computation load per sample being less than the first computation load per sample;

wherein a ratio of the first quantity of digital signal samples per unit time to the second quantity of digital samples per unit time is approximately equal to a ratio of the second computation load to the first computation load.

2. The processor circuit according to claim 1, wherein a ratio of the first quantity of digital samples per unit time to the second quantity of digital samples per unit time is approximately 1:2.

3. The processor circuit according to claim 1, wherein a ratio of the first computation load to the second computation load is approximately 2:1.

4. The processor circuit according to claim 1, further comprising at least one calculation circuit, wherein the processor circuit is configured such that in the non-adaptive mode, the at least one calculation circuit performs numerical calculations for a filter calculation for applying filter coefficients to the digital signal samples, and in the adaptive mode, the calculation circuit performs, for at least a part of a time the adaptive filter is in the adaptive mode, numerical calculations for updating the filter coefficients.

5. The processor circuit according to claim 4, wherein the at least one calculation circuit is a multiplier.

6. The processor circuit according to claim 4, wherein said at least one calculation circuit comprises a first calculation circuit that is used for the filter calculation when the adaptive filter is operating in the non-adaptive mode, and a second calculation circuit that is used for coefficient update calculations when the adaptive filter is operating in the adaptive mode.

7. The processor circuit according to claim 4, wherein the at least one calculation circuit comprises at least a first calculation circuit and a second calculation circuit, which are operable to perform numerical calculations in parallel with each other, for parallel processing signal paths, and wherein when the adaptive filter is operating in the non-adaptive mode, the first and second calculation circuits each perform numerical calculations for the filter calculation, and when the adaptive filter is operating in the adaptive mode, the first calculation circuit performs numerical calculations for the filter calculation and the second calculation circuit performs numerical calculations for updating the filter coefficients.

8. The processor circuit according to claim 1, wherein the adaptive filter is a Wiener filter.

9. The processor circuit according to claim 2, wherein when the adaptive filter is operating in the non-adaptive mode, the adaptive filter has substantially zero adaptability.

10. The processor circuit according to claim 1, further comprising a control circuit which is configured to control the operating mode of the adaptive filter according to whether a signal of interest is detected.

11. An integrated circuit comprising the processing circuit as defined in claim 1.

12. A receiver comprising the processing circuit as defined in claim 1.

13. A processor Circuit for suppressing interference in a received signal represented as digital signal samples, the processor circuit comprising: an adaptive filter which is configured to operate in an adaptive mode in which the adaptive filter adapts to changes in the received signal, and in a non-adaptive mode in which the adaptive filter has a reduced adaptability compared to the adaptive mode; wherein the adaptive filter comprises a first calculation circuit and a second calculation circuit, and wherein the processor circuit is configured such that: in the non-adaptive mode, the first calculation circuit and the second calculation circuit both perform a filter calculation for applying digital filter coefficients to the digital signal samples; and in the adaptive mode, the first calculation circuit performs a filter calculation, and the second calculation circuit performs a coefficient update calculation for adaptively updating the digital filter coefficients; wherein, in the non-adaptive mode, the first calculation circuit and the second calculation circuit are operable to perform numerical calculations in parallel with each other, for parallel processing signal paths.

14. The processor circuit according to claim 13, wherein the adaptive filter is a Wiener filter.

15. The processor circuit according to claim 14, wherein the filter is an least minimum square (LMS) adaptive filter.

16. The processor circuit according to claim 15, wherein the filter is an LMS adaptive filter with leakage.

17. The processor circuit according to claim 13, wherein when the adaptive filter is operating in the non-adaptive mode, the adaptive filter has substantially zero adaptability.

18. The processor circuit according to claim 13, further comprising a control circuit which is configured to control the operating mode of the adaptive filter according to whether a signal of interest is detected.

19. An integrated circuit comprising the processing circuit as defined in claim 13.

20. A receiver comprising the processing circuit as defined in claim 13.

21. A method of processing a received signal to suppress interference in the received signal, the method comprising:

implementing an adaptive filter provided in a processor circuit which is configured to operate in an adaptive mode to adapt to changes in the received signal, and in a second mode having a reduced adaptability compared to the adaptive mode;

operating the adaptive filter in the adaptive mode to process a first quantity of digital signal samples per unit time; and operating the adaptive filter in the second mode to process a second quantity of digital signal samples per unit time;

wherein the first quantity is less than the second quantity;

wherein, in the second mode, the adaptive filter performs numerical calculations in parallel with each other, for parallel processing signal paths, and the numerical calculations in parallel are filter calculations.

22. The method according to claim 21, wherein operating the adaptive filter in the adaptive mode comprises performing calculations having a first computation load per sample, and operating the adaptive filter in the second mode comprises performing calculations having a second computation load per sample, the second computation load per sample being less than the first computation load per sample.

23. The method according to claim 22, wherein a ratio of the first quantity of digital signal samples per unit time to the second quantity of digital samples per unit time is approximately equal to a ratio of the second computation load per sample to the first computation load per sample.

24. The method of claim 22, wherein the ratio of the second computation load per sample to the first computation load per sample is approximately 1:2.

25. The method according to claim 21, wherein a ratio of the first quantity of digital samples per unit time to the second quantity of digital samples per unit time is approximately 1:2.

26. The method according to claim 21, wherein:

operating the filter in the second mode comprises configuring at least one calculation circuit that is dedicated to performing numerical calculations, to perform a first calculation forming at least part of a filter result calculation based on filter coefficients; and operating the filter in the adaptive mode comprises configuring the at least one calculation circuit to perform, for at least part of a time the adaptive filter is operating in the adaptive mode, a second calculation forming at least part of a calculation for updating the filter coefficients.

27. The method according to claim 26, wherein the calculation circuit is a multiplier.

28. The method according to claim 26, wherein:

operating the filter in the second mode comprises configuring a first calculation circuit and a second calculation circuit each to perform the first calculation; and operating the filter in the adaptive mode comprises configuring the first calculation circuit to perform the first calculation, and configuring the second calculation circuit to perform the second calculation.

29. The method according to claim 21, further comprising storing the filtered signal in a non-transitory storage medium.

30. A non-transitory computer readable storage medium storing thereon executable instructions which, when executed on a processor, control the processor to implement the method as defined in claim 21.

31. A method of processing a received signal to suppress interference in the signal, the method comprising:

implementing an adaptive filter provided in a processor circuit which is configured to operate in an adaptive mode to adapt to changes in the received signal, and in a second mode having a reduced adaptability compared to the adaptive mode;

operating the adaptive filter in the second mode by configuring a first calculation circuit and a second calculation circuit each to perform a first calculation forming at least part of a filter result calculation based on filter coefficients, the first and second calculation circuits being provided in parallel with each other, for parallel processing signal paths; and operating the adaptive filter in the adaptive mode by configuring the first calculation circuit to perform the first calculation, and configuring the second calculation circuit to perform a second calculation forming at least part of an update calculation for updating the filter coefficients.

32. The method according to claim 31, further comprising storing the filtered signal in a non-transitory storage medium.

33. A non-transitory computer readable storage medium storing thereon executable instructions which, when executed on a processor, control the processor to implement the method as defined in claim 31.

* * * * *